(12) United States Patent
Lv et al.

(10) Patent No.: US 9,383,600 B2
(45) Date of Patent: Jul. 5, 2016

(54) BACKLIGHT MODULES, LIQUID CRYSTAL DEVICES, AND OLED DISPLAY DEVICES

(71) Applicant: Shenzhen China Star Optoelectronics Technology Co., Ltd., Shenzhen, Guangdong (CN)

(72) Inventors: Chengling Lv, Guangdong (CN); Yajun Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 174 days.

(21) Appl. No.: 14/369,682

(22) PCT Filed: Jun. 13, 2014

(86) PCT No.: PCT/CN2014/079839
§ 371 (c)(1),
(2) Date: Jun. 27, 2014

(87) PCT Pub. No.: WO2015/188370
PCT Pub. Date: Dec. 17, 2015

(65) Prior Publication Data
US 2015/0362790 A1    Dec. 17, 2015

(30) Foreign Application Priority Data

Jun. 11, 2014   (CN) .......................... 2014 1 0256637

(51) Int. Cl.
*G02F 1/1333*   (2006.01)
*H01L 51/52*    (2006.01)
(Continued)

(52) U.S. Cl.
CPC .......... *G02F 1/133382* (2013.01); *H01L 33/00* (2013.01); *G02F 1/133305* (2013.01); *G02F 1/133308* (2013.01); *G02F 1/133615* (2013.01); *G02F 2001/133314* (2013.01); *H01L 51/529* (2013.01); *H01L 2251/5338* (2013.01)

(58) Field of Classification Search
CPC .............. G02F 2001/133314; G02F 1/133308; G02F 1/133305; G02F 1/133382; G02F 1/1336; H01L 33/00; H01L 51/529
USPC ..................................................... 349/58, 60
See application file for complete search history.

(56) References Cited

U.S. PATENT DOCUMENTS

| 4,383,004 A * | 5/1983 | Spengler ................... G01K 5/66 148/529 |
| 2009/0169918 A1 * | 7/2009 | Haynes ................. B32B 15/013 428/656 |
| 2010/0188422 A1 * | 7/2010 | Shingai ................... G06F 3/016 345/647 |

(Continued)

FOREIGN PATENT DOCUMENTS

CN              103093699 A           5/2013

*Primary Examiner* — Paul Lee
*Assistant Examiner* — Jia Pan
(74) *Attorney, Agent, or Firm* — Andrew C. Cheng

(57) ABSTRACT

A backlight module including a back plate and a heating device is disclosed. The back plate includes a passive layer and an active layer adhered below the passive layer, wherein a coefficient of heat expansion of the active layer is greater than that of the passive layer. The heating device is configured for controlling a heating temperature of the back plate so as to adjust a rate of curvature of the back plate toward a liquid crystal panel. In addition, a LCD and an OLED display device are also disclosed. The rates of curvature of the backlight module, the LCD, and the OLED display device may be adjusted accordingly.

4 Claims, 2 Drawing Sheets

(51) Int. Cl.
*G02F 1/1335* (2006.01)
*H01L 33/00* (2010.01)

(56) References Cited

U.S. PATENT DOCUMENTS

2011/0255047 A1* 10/2011 Kim .................. G02F 1/133382
349/161

2013/0114193 A1* 5/2013 Joo ........................ F16M 11/08
361/679.01
2013/0194512 A1* 8/2013 Nishimoto ........ G02F 1/133308
348/790
2014/0055429 A1* 2/2014 Kwon .................... G09G 3/001
345/204
2014/0118910 A1* 5/2014 Sung ....................... G09F 9/301
361/679.01

\* cited by examiner

BACKLIGHT MODULES, LIQUID CRYSTAL DEVICES, AND OLED DISPLAY DEVICES

BACKGROUND OF THE INVENTION

1. Field of the Invention

The present disclosure relates to display technology, and more particularly to a backlight module, a liquid crystal display (LCD), and an Organic Light-Emitting Diode (OLED) display device.

2. Discussion of the Related Art

With the growth of the flat-panel dimension, distances between the edges of the panel and human eyes and between a central portion and the human eyes increase also, which results in image and color distortion. One general solution is to bend the panel such that curved LCD TVs can perform in a better way than traditional flat-LCD TVs. For example, arc panels of IMAX theaters contribute to same users experience regardless of his/her locations. The principle of curved TV is quite the same of that of the IMAX panel. By deliberately designing the angle of the arc, the distance between the users and each points of the panel are the same. This not only resolves the above distortion problem, but also provide an overall view such that the users may share the same performance like being in the IMAX theater.

FIG. 1 is a schematic view of one conventional curved LCD. As shown in FIG. 1, the LCD includes a bent backlight module 110 and a bent open cell 120 opposite to the backlight module 110. By engaging an outer frame 130 and a plastic frame 111, the backlight module 110 and the open cell 120 are assembled. As it is difficult to manufacture a large-scale metallic sheet, usually, a bent steel support 113 is manufactured and then the steel support 113 is assembled to a flat back frame 112 by assembling components 114. Afterward, the flat back frame 112 is bent so as to form a bent backlight module 110. However, the curvature of the backlight module 110 is fixed, which means it cannot be adjusted accordingly.

SUMMARY

A backlight module includes: a back plate comprising a passive layer and an active layer adhered below the passive layer, wherein a coefficient of heat expansion of the active layer is greater than that of the passive layer; and a heating device configured for controlling a heating temperature of the back plate so as to adjust a rate of curvature of the back plate toward a liquid crystal panel.

Wherein the back plate is made by thermobimetal material, and a specific thermal deflection range of the back plate is between $10 \times 10^{-6}$ $K^{-1}$ and $20 \times 10^{-6}$ $K^{-1}$.

Wherein the heating device includes: a heating sheet being adhered to a down surface of the active layer or an up surface of the passive layer to heat up the back plate; a temperature controlling device for controlling the heating temperature of the back plate being heated up by the heating sheet; and a temperature sensor for measuring a current temperature of the back plate.

Wherein the heating device includes: an electrode being adhered to a down surface of the active layer or an up surface of the passive layer for electrifying and heating up the back plate; a temperature controlling device for electrifying the electrode or for cutting off a power supply of the electrode so as to control the heating temperature of the back plate; and a temperature sensor for measuring a current temperature of the back plate.

Wherein the backlight module further includes an insulation sheet arranged on the down surface of the active layer.

In another aspect, a liquid crystal device includes a backlight module and a liquid crystal panel arranged above the backlight module, the backlight module includes: a back plate comprising a passive layer and an active layer adhered below the passive layer, wherein a coefficient of heat expansion of the active layer is greater than that of the passive layer; and a heating device configured for controlling a heating temperature of the back plate so as to adjust a rate of curvature of the back plate toward a liquid crystal panel.

Wherein the back plate is made by thermobimetal material, and a specific thermal deflection range of the back plate is of a range between $10 \times 10^{-6}$ $K^{-1}$ and $20 \times 10^{-6}$ $K^{-1}$.

Wherein the heating device includes: a heating sheet being adhered to a down surface of the active layer or an up surface of the passive layer to heat up the back plate; a temperature controlling device for controlling the heating temperature of the back plate being heated up by the heating sheet; and a temperature sensor for measuring a current temperature of the back plate.

Wherein the heating device includes: an electrode being adhered to a down surface of the active layer or an up surface of the passive layer for electrifying and heating up the back plate; a temperature controlling device for electrifying the electrode or for cutting off a power supply of the electrode so as to control the heating temperature of the back plate; and a temperature sensor for measuring a current temperature of the back plate.

Wherein the backlight module further includes an insulation sheet arranged on the down surface of the active layer.

In another aspect, an OLED display device includes a back plate and a OLED display panel arranged on the back plate, the OLED display device includes: the back plate includes a passive layer and an active layer adhered below the passive layer, wherein a coefficient of heat expansion of the active layer is greater than that of the passive layer; and a heating device configured for controlling a heating temperature of the back plate so as to adjust a rate of curvature of the back plate toward the OLED display panel.

Wherein the back plate is made by thermobimetal material, and a specific thermal deflection range of the back plate is between $10 \times 10^{-6}$ $K^{-1}$ and $20 \times 10^{-6}$ $K^{-1}$.

Wherein the heating device includes: a heating sheet being adhered to a down surface of the active layer or an up surface of the passive layer to heat up the back plate; a temperature controlling device for controlling the heating temperature of the back plate being heated up by the heating sheet; and a temperature sensor for measuring a current temperature of the back plate.

Wherein the heating device includes: a heating sheet being adhered to a down surface of the active layer or an up surface of the passive layer to heat up the back plate; a temperature controlling device for controlling the heating temperature of the back plate being heated up by the heating sheet; and a temperature sensor for measuring a current temperature of the back plate.

Wherein the heating device includes: an electrode being adhered to a down surface of the active layer or an up surface of the passive layer for electrifying and heating up the back plate; a temperature controlling device for electrifying the electrode or for cutting off a power supply of the electrode so as to control the heating temperature of the back plate; and a temperature sensor for measuring a current temperature of the back plate.

Wherein the heating device includes: an electrode being adhered to a down surface of the active layer or an up surface of the passive layer for electrifying and heating up the back plate; a temperature controlling device for electrifying the electrode or for cutting off a power supply of the electrode so as to control the heating temperature of the back plate; and a temperature sensor for measuring a current temperature of the back plate.

Wherein the OLED display device further includes an insulation sheet arranged on the down surface of the active layer.

Wherein the OLED display device further includes an insulation sheet arranged on the down surface of the active layer.

In view of the above, the rate of curvature of the backlight module, the LCD, and the OLED display device may be adjusted accordingly.

DETAILED DESCRIPTION OF THE EMBODIMENTS

The exemplary embodiments will be more fully described below in conjunction with the accompanying drawings of the claimed invention. However, the claimed invention may be embodied in many different forms and should not be construed as limited to the embodiments set forth herein. Rather, these embodiments are provided so that this invention be thorough and complete, and to the person skilled in the art will fully convey the scope of the claimed invention.

Figure 1:
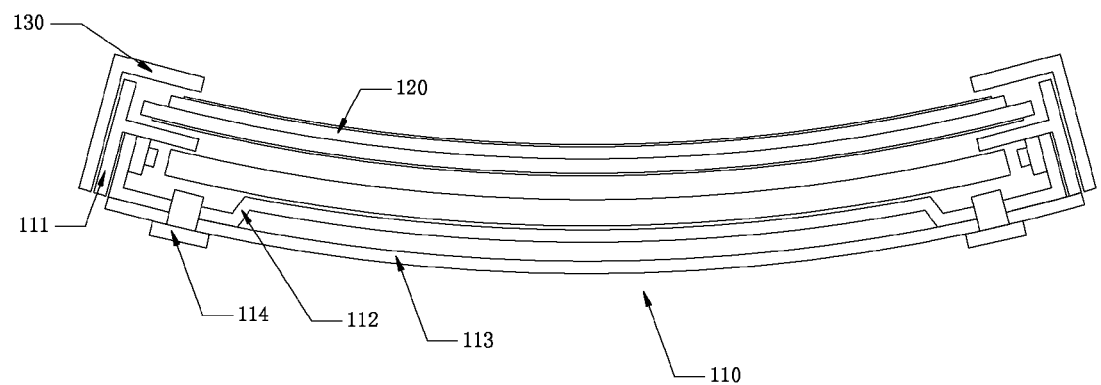
FIG. 1 is a schematic view of one conventional curved LCD.
Figure 2:
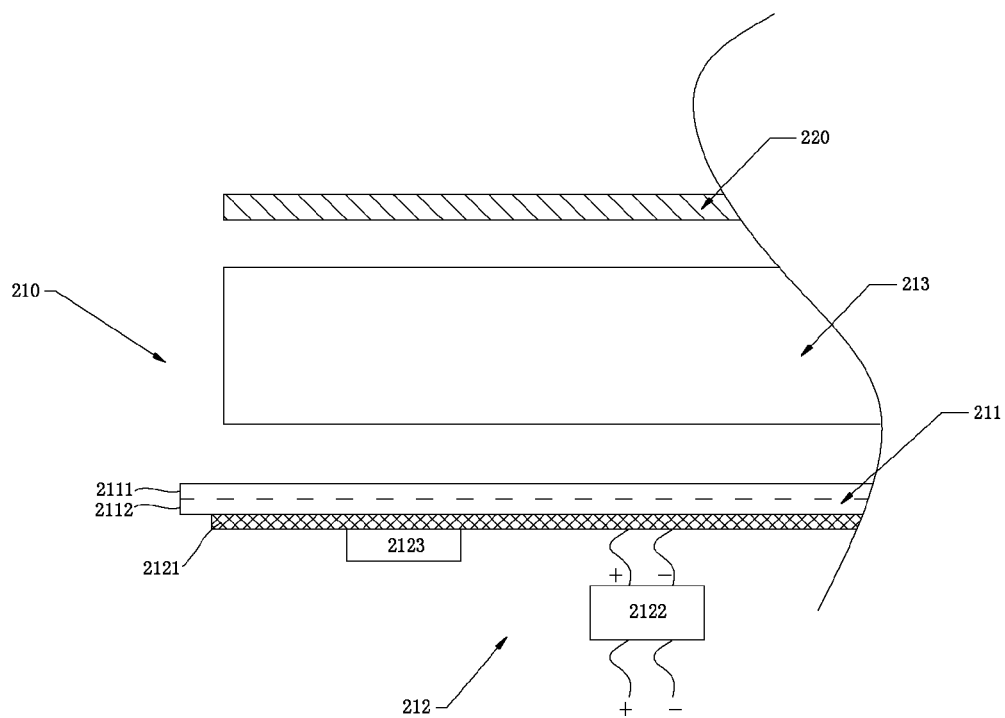
FIG. 2 is a side view of the LCD in accordance with one embodiment.

FIG. 2 is a side view of the LCD in accordance with one embodiment.

Referring to FIG. 2, the LCD includes a backlight module 210, a liquid crystal panel 220 and an outer frame (not shown). The liquid crystal panel 220 is arranged on the backlight module 210. The outer frame is arranged above the liquid crystal panel 220 and is assembled with the backlight module 210 such that the liquid crystal panel 220 is fixed on the backlight module 210 to form the LCD. The backlight module 210 provides a display light source such that the liquid crystal panel 220 is capable of displaying images.

The backlight module 210 includes a back plate 211, a heating device 212 and a light guiding plate 213 on the back plate 211, optical films (not shown), and so on. In the embodiment, the back plate 211 is made by, but not limited to thermobimetal material, which includes two consolidated layers of metal or alloy with different coefficient of heat expansion. For instance, the back plate 211 may be made by three or more consolidated layers of metal or alloy with different coefficient of heat expansions. Specifically, the back plate 211 includes a passive layer 2111 and an active layer 2112 adhered below the passive layer 2111. The coefficient of heat expansion of the active layer 2112 is greater than that of the passive layer 2111. In addition, a specific thermal deflection range of the back plate 211 made by thermobimetal material is of a range between $10\times10^{-6} K^{-1}$ and $20\times10^{-6} K^{-1}$, wherein K represents the units of thermodynamic temperature. For instance, the thermobimetal material may be the one with serial numbers equaling to 5J1306A, 5J1425A, 5J1430A, 5J1435A, and so on.

The heating device 212 includes a heating sheet 2121, a temperature controlling device 2122 and a temperature sensor 2123. The heating sheet 2121 is characterized by attributes including thin, fastly-heated, may be deformed in accordance with the heated objects, and capable of uniformly transmitting the heat to all of the contact points. For instance, the heating device 212 may be, but not limited to, silicagel flexible heating sheet. The heating sheet 2121 is adhered to a down surface of the active layer 2112 for heating the back plate 211. After being heated, as the thermo coefficient of the active layer 2112 is greater than that of the passive layer 2111, the heat transformation of the active layer 2112 is greater than that of the passive layer 2111 such that the back plate 211 is bent upward. That is, the back plate 211 protrudes along a direction opposite to the liquid crystal panel 220. At the same time, the components of the backlight module 210, i.e., 213, and the liquid crystal panel 220 is bent upward so as to form the curved LCD.

In another embodiment, the heating device 212 may be adhered to an up surface of the passive layer 2111. In this way, the back plate 211 is bent upward.

The temperature sensor 2123 is arranged below the heating sheet 2121 and is adhered to the heating sheet 2121 for measuring a current temperature of the back plate 211. The temperature controlling device 2122 is for controlling a heating temperature for the back plate 211. In this way, users may configure the heating temperature of the temperature controlling device 2122 in accordance with the current temperature measured by the temperature sensor 2123 so as to control the curvature of the back plate 211. That is, the curvature of the backlight module 210 may be adjusted accordingly.

Figure 3:
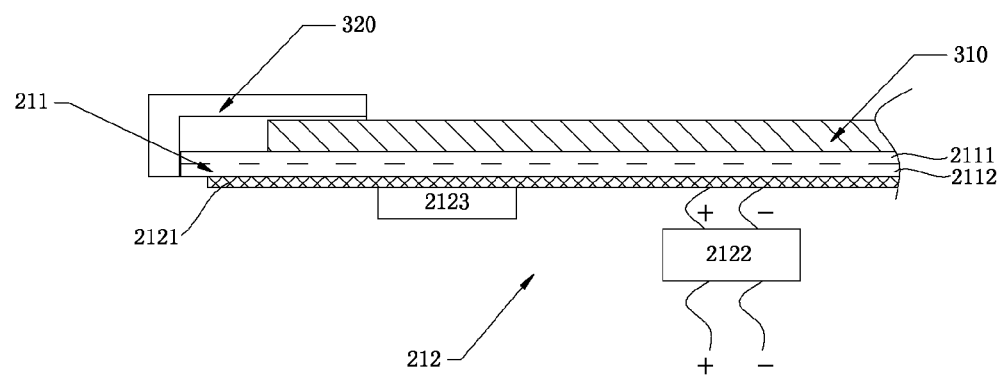
FIG. 3 is a side view of the OLED display device in accordance with one embodiment.

FIG. 3 is a schematic view of the OLED display device in accordance with one embodiment.

Referring to FIG. 3, the OLED display device includes a back plate 211, an OLED display panel 310, and an outer frame 320.

The display panel 310 is arranged on the back plate 211. The outer frame 320 is arranged on the display panel 310 and is assembled with the back plate 211 such that the display panel 310 is fixed on the back plate 211 to form the OLED display device.

In the embodiment, the back plate 211 is made by, but not limited to thermobimetal material, which includes two consolidated layers of metal or alloy with different coefficient of heat expansion. For instance, the back plate 211 may be made by three or more consolidated layers of metal or alloy with different coefficient of heat expansions. Specifically, the back plate 211 includes a passive layer 2111 and an active layer 2112 adhered below the passive layer 2111. The coefficient of heat expansion of the active layer 2112 is greater than that of the passive layer 2111. In addition, a specific thermal deflection range of the back plate 211 made by thermobimetal material is within $10\times10-6\sim20\times10-6$ K-1, wherein K represents the units of thermodynamic temperature. For instance, the thermobimetal material may be the one with serial numbers equaling to 5J1306A, 5J1425A, 5J1430A, 5J1435A, and so on.

The heating device 212 includes a heating sheet 2121, a temperature controlling device 2122 and a temperature sensor 2123. The heating sheet 2121 is characterized by attributes including thin, fastly-heated, may be deformed in accordance with the heated objects, and capable of uniformly transmitting the heat to all of the contact points. For instance, the heating device 212 may be, but not limited to, silicagel flexible heating sheet. The heating sheet 2121 is adhered to a down surface of the active layer 2112 for heating the back plate 211. After being heated, as the thermo coefficient of the active layer 2112 is greater than that of the passive layer 2111, the heat transformation of the active layer 2112 is greater than that of the passive layer 2111 such that the back plate 211 bent upward. That is, the back plate 211 is bent toward the OLED display panel 310. At the same time, the display panel 310 is bent upward so as to form the curved OLED LCD.

In another embodiment, the heating device 212 may be adhered to an up surface of the passive layer 2111. In this way, the back plate 211 is bent upward. The temperature sensor 2123 is arranged below the heating device 212 and is adhered to the heating sheet 2121 for measuring a current temperature of the back plate 211. The temperature controlling device 2122 is for controlling a heating temperature for the back plate 211. In this way, users may configure the heating temperature of the temperature controlling device 2122 in accordance with the current temperature measured by the temperature sensor 2123 so as to control the curvature of the back plate 211. In this way, the curvature of the OLED display device may be adjusted accordingly. For instance, a predetermined heating temperature is configured within the temperature controlling device 2122. Upon determining that the current temperature of the back plate 211 measured by the temperature sensor 2123 is the same with the predetermined heating temperature, the temperature controlling device 2122 controls the heating sheet 2121 to stop heating up the back plate 211. For instance, the temperature controlling device 2122 cuts off the power supply of the heating sheet 2121. Otherwise, the temperature controlling device 2122 controls the heating sheet 2121 to heat up the back plate 211, i.e., the temperature controlling device 2122 turns on the power supply of the heating sheet 2121.

The process of controlling the heating temperature for the back plate 211 by the temperature controlling device 2122 to form the backlight module 210 with different curvatures will be described hereinafter.

Figure 4:
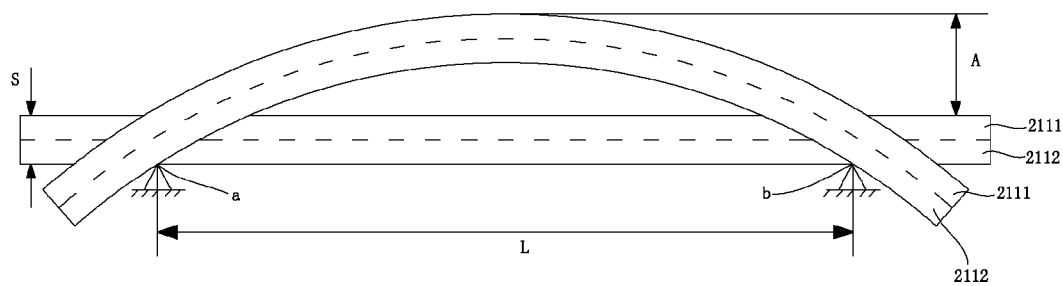
FIG. 4 is a schematic view showing the back plate before and after being heated in accordance with one embodiment.

FIG. 4 is a schematic view showing the back plate before and after being heated in accordance with one embodiment.

Referring to FIG. 4, when the back plate 211 is in a straight state, the current temperature of the back plate 211 measured by the temperature sensor 2123 is T1. When the back plate 211 is in a bent state, the current temperature of the back plate 211 measured by the temperature sensor 2123 is T2, which is also the predetermined heating temperature of the temperature controlling device 2122.

When the back plate 211 is heated until the temperature equaling to T2, the rate of curvature of the back plate 211 is represented by the equation below.

$$r = S \times (T2-T1)/F;$$

wherein r represents rate of curvature of the back plate 211, and F represents the rate of temperature of the material (see below).

$$F = 8AS/[(L^2 + 4A^2 + 4AS) \times (T2-T1)];$$

Wherein S represents a thickness when the back plate 211 is in the straight state, L represents a distance between points "a" and "b" when the back plate 211 is in the straight state, and A represents central deflection (see below).

$$A = K \times (T2-T1) \times L^2/S;$$

Wherein K represents specific thermal deflection, which is a constant number. S represents a thickness when the back plate 211 is in the straight state, L represents a distance between point "a" and "b" when the back plate 211 is in the straight state.

In view of the above, the curvature of the back plate 211 may be adjusted by configuring the predetermined heating temperature T2.

Figure 5:
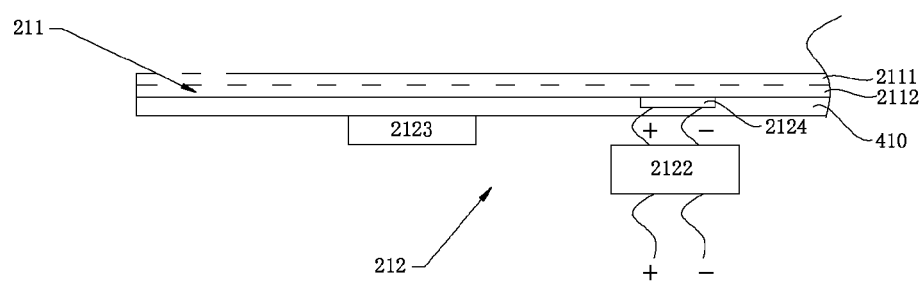
FIG. 5 is a schematic view of the back plate being heated by a heating device in accordance with one embodiment.

FIG. 5 is a schematic view of the back plate being heated by a heating device in accordance with one embodiment.

Referring to FIG. 5, the heating device 212 includes an electrode 2124, the temperature controlling device 2122 and the temperature sensor 2123. The electrode 2124 adheres to a down surface of the active layer 2112 such that the electrode 2124 electrifies the back plate 211 directly so as to heat up the back plate 211. After the back plate 211 is heated, as the thermo coefficient of the active layer 2112 is greater than that of the passive layer 2111, the heat transformation of the active layer 2112 is greater than that of the passive layer 2111 such that the back plate 211 is bent upward. That is, the back plate 211 is bent toward the passive layer 2111.

In one embodiment, the electrode 2124 is adhered to an up surface of the passive layer 2111. Similarly, the back plate 211 may be bent upward.

The temperature sensor 2123 is arranged below the down surface of the active layer 2112 for measuring the current temperature of the back plate 211. The temperature controlling device 2122 is configured for electrifying the electrode 2124 or for cutting off the power supply of the electrode 2124 so as to control the heating temperature for the back plate 211. As such, the rate of curvature of the back plate 211 is controlled. For instance, the temperature controlling device 2122 has configured the predetermined heating temperature. When the current temperature of the back plate 211 reaches the predetermined heating temperature, the temperature controlling device 2122 cuts off the power supply of the electrode 2124. When the current temperature of the back plate 211 is smaller than the predetermined heating temperature, the temperature controlling device 2122 electrifies the electrode 2124.

In addition, an insulation sheet 410 is arranged on the down surface of the active layer 2112 so as to avoid the electricity leakage when the back plate 211 is electrified.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A backlight module, comprising:
a back plate comprising a passive layer and an active layer adhered below the passive layer, wherein a coefficient of heat expansion of the active layer is greater than that of the passive layer;
an insulation sheet arranged on a down surface of the active layer;
a heating device comprises an electrode and a temperature controlling device, the electrode being arranged within the insulation sheet for electrifying and heating up the back plate, and the temperature controlling device for controlling a heating temperature of the back plate; and
when the back plate is heated, a center of the back plate protrudes along a direction from the back plate toward a liquid crystal panel.

2. The backlight module as claimed in claim 1, wherein the back plate is made by thermobimetal material, and a specific thermal deflection range of the back plate is between $10 \times 10^{-6}$ $K^{-1}$ and $20 \times 10^{-6} K^{-1}$.

3. A liquid crystal device comprises a backlight module and a liquid crystal panel arranged above the backlight module, the backlight module comprising:

a back plate comprising a passive layer and an active layer adhered below the passive layer, wherein a coefficient of heat expansion of the active layer is greater than that of the passive layer; and an insulation sheet arranged on a down surface of the active layer;

a heating device comprises an electrode and a temperature controlling device, the electrode being arranged within the insulation sheet for electrifying and heating up the back plate, and the temperature controlling device for controlling a heating temperature of the back plate; and when the back plate is heated, a center of the back plate protrudes along a direction from the back plate toward the liquid crystal panel.

4. The liquid crystal device as claimed in claim 3, wherein the back plate is made by thermobimetal material, and a specific thermal deflection range of the back plate is of a range between $10 \times 10^{-6} K^{-1}$ and $20 \times 10^{-6} K^{-1}$.

* * * * *